US007413801B2

(12) United States Patent
Miller et al.

(10) Patent No.: US 7,413,801 B2
(45) Date of Patent: *Aug. 19, 2008

(54) AQUEOUS FORMALDEHYDE-FREE COMPOSITION AND FIBERGLASS INSULATION INCLUDING THE SAME

(75) Inventors: Wayne P. Miller, St. Paul, MN (US); Stewart C. Anderson, Eden Prairie, MN (US); Michael J. Dochniak, White Bear Lake, MN (US)

(73) Assignee: H.B. Fuller Licensing & Financing, Inc., St. Paul, MN (US)

( * ) Notice: Subject to any disclaimer, the term of this patent is extended or adjusted under 35 U.S.C. 154(b) by 272 days.

This patent is subject to a terminal disclaimer.

(21) Appl. No.: 11/407,761

(22) Filed: Apr. 20, 2006

(65) Prior Publication Data

US 2006/0189773 A1   Aug. 24, 2006

Related U.S. Application Data

(63) Continuation of application No. 10/222,617, filed on Aug. 16, 2002.

(51) Int. Cl.
B32B 9/00 (2006.01)

(52) U.S. Cl. .................. 428/365; 428/396; 428/407; 525/328.8

(58) Field of Classification Search .................. 428/365, 428/396, 407; 525/328.8
See application file for complete search history.

(56) References Cited

U.S. PATENT DOCUMENTS

| | | |
|---|---|---|
| 3,116,270 A | 12/1963 | Pennino |
| 3,387,061 A | 6/1968 | Smith et al. |
| 3,669,942 A | 6/1972 | Van Westrenen et al. |
| 3,950,398 A | 4/1976 | Klein |
| 4,077,926 A | 3/1978 | Sanderson et al. |
| 4,157,994 A | 6/1979 | Meier et al. |
| 4,331,438 A | 5/1982 | Pai |
| 4,396,680 A | 8/1983 | Chang |
| 4,435,556 A | 3/1984 | Masler, III |
| 4,534,866 A | 8/1985 | Becker |
| 4,621,127 A | 11/1986 | Denzinger et al. |
| 4,743,664 A | 5/1988 | Matui et al. |
| 4,861,539 A | 8/1989 | Allen et al. |
| 4,936,865 A | 6/1990 | Welch et al. |
| 4,980,433 A | 12/1990 | Chen et al. |
| 5,028,655 A | 7/1991 | Stack |
| 5,073,612 A | 12/1991 | Irie et al. |
| 5,077,361 A | 12/1991 | Hughes et al. |
| 5,137,963 A | 8/1992 | Stack |
| 5,143,582 A | 9/1992 | Arkens et al. |
| 5,147,956 A | 9/1992 | Allen |
| 5,179,173 A | 1/1993 | Fong et al. |
| 5,185,413 A | 2/1993 | Yoshinaga et al. |
| 5,190,996 A | 3/1993 | Foran et al. |
| 5,216,099 A | 6/1993 | Hughes et al. |
| 5,219,969 A | 6/1993 | Uhl et al. |
| 5,256,746 A | 10/1993 | Blankenship et al. |
| 5,280,079 A | 1/1994 | Allen et al. |
| 5,294,686 A | 3/1994 | Fiarman et al. |
| 5,314,943 A | 5/1994 | Steinwand |
| 5,318,990 A | 6/1994 | Strauss |
| 5,340,868 A | 8/1994 | Strauss et al. |
| 5,354,803 A | 10/1994 | Dragner et al. |
| 5,376,731 A | 12/1994 | Kerr et al. |
| 5,409,571 A | 4/1995 | Togo et al. |
| 5,410,004 A | 4/1995 | Williams |
| 5,427,587 A | 6/1995 | Arkens et al. |
| 5,498,658 A | 3/1996 | Pourhmady et al. |
| 5,520,997 A | 5/1996 | Pourhmady et al. |
| 5,536,766 A | 7/1996 | Seyffer et al. |
| 5,549,852 A | 8/1996 | Bell |
| 5,578,371 A | 11/1996 | Taylor et al. |
| 5,604,291 A | 2/1997 | Kerr et al. |
| 5,661,213 A | 8/1997 | Arkens et al. |
| 5,667,848 A | 9/1997 | Wuestefeld et al. |
| 5,670,585 A | 9/1997 | Taylor et al. |
| 5,691,432 A | 11/1997 | Williams |
| 5,693,707 A | 12/1997 | Cheng et al. |
| 5,705,475 A | 1/1998 | Tang et al. |
| 5,718,728 A | 2/1998 | Lonati et al. |
| 5,728,771 A | 3/1998 | Tang et al. |
| 5,753,746 A | 5/1998 | Rupaner et al. |
| 5,763,524 A | 6/1998 | Arkens et al. |
| 5,840,822 A | 11/1998 | Lee et al. |
| 5,858,549 A | 1/1999 | Kielbania, Jr. et al. |
| 5,866,664 A | 2/1999 | McCallum, III et al. |

(Continued)

FOREIGN PATENT DOCUMENTS

| | | |
|---|---|---|
| DE | 19949591 | 4/2001 |
| EP | 0397410 | 11/1990 |
| EP | 651088 A1 | 5/1995 |
| EP | 583086 B1 | 11/1997 |
| EP | 964026 A1 | 12/1999 |
| EP | 990729 A1 | 4/2000 |
| WO | WO 99/64505 | 12/1999 |

OTHER PUBLICATIONS

TAPPI Test Method T494 OM-96 entitled, "Tensile properties of paper and paperboard (using constant rate of elongation apparatus)," (1996) (11 pages).
TAPPI Test Method T1009 OM-92 entitled, "Tensile strength and elongation at break," (1992) (2 pages).
H.B. Fuller Company Proprietary Information (submitted under MPEP 724.02 in a sealed envelope).

*Primary Examiner*—Bernard Lipman

(57) ABSTRACT

An aqueous composition that includes a) aqueous hydroxy functional, carboxy functional polymer including the reaction product of at least 5% by weight α,β-ethylenically unsaturated hydroxy monomer, at least 30% by weight ethylenically unsaturated carboxylic acid monomer, from 0% by weight to less than 50% by weight α,β-ethylenically unsaturated nonhydroxy functional, noncarboxy functional monomer, and chain transfer agent, and b) condensation accelerator, and articles that include a nonwoven web including glass fibers, and cured aqueous binder composition.

23 Claims, No Drawings

U.S. PATENT DOCUMENTS

| | | | |
|---|---|---|---|
| 5,891,972 A | 4/1999 | Egraz et al. | |
| 5,919,716 A | 7/1999 | Raynolds et al. | |
| 5,932,665 A | 8/1999 | DePorter et al. | |
| 5,932,689 A | 8/1999 | Arkens et al. | |
| 5,935,689 A | 8/1999 | Foley et al. | |
| 5,977,224 A | 11/1999 | Cheung et al. | |
| 5,977,232 A | 11/1999 | Arkens et al. | |
| 6,051,646 A | 4/2000 | Nass et al. | |
| 6,063,498 A | 5/2000 | Licht et al. | |
| 6,063,884 A | 5/2000 | Egraz et al. | |
| 6,071,434 A | 6/2000 | Davis et al. | |
| 6,071,994 A | 6/2000 | Hummerich et al. | |
| 6,099,773 A | 8/2000 | Reck et al. | |
| 6,103,789 A | 8/2000 | Marciandi et al. | |
| 6,114,464 A | 9/2000 | Reck et al. | |
| 6,136,916 A | 10/2000 | Arkens et al. | |
| 6,139,916 A | 10/2000 | Saruhan-Brings et al. | |
| 6,146,746 A | 11/2000 | Reck et al. | |
| 6,171,654 B1 | 1/2001 | Salsman et al. | |
| 6,184,321 B1 | 2/2001 | Egraz et al. | |
| 6,194,512 B1 | 2/2001 | Chen et al. | |
| 6,221,973 B1 | 4/2001 | Arkens et al. | |
| 6,241,780 B1 | 6/2001 | Arkens et al. | |
| 6,262,159 B1 | 7/2001 | Dreher et al. | |
| 6,274,661 B1 | 8/2001 | Chen et al. | |
| 6,297,336 B1 | 10/2001 | Shioji et al. | |
| 6,299,936 B1 | 10/2001 | Reck et al. | |
| 6,309,565 B1 | 10/2001 | Stowell et al. | |
| 6,331,350 B1 | 12/2001 | Taylor et al. | |
| 6,335,406 B1 | 1/2002 | Nagasuna et al. | |
| 6,348,530 B1 | 2/2002 | Reck et al. | |
| 6,380,353 B1 | 4/2002 | Rupaner et al. | |
| 6,395,813 B1 | 5/2002 | Duccini et al. | |
| 6,399,694 B1 | 6/2002 | McGrath et al. | |
| 6,410,647 B1 | 6/2002 | Yoshioka et al. | |
| 6,444,750 B1 | 9/2002 | Touhsaent | |
| 6,472,478 B1 | 10/2002 | Funk et al. | |
| 6,489,287 B1 | 12/2002 | Gauthier et al. | |
| 6,582,476 B1 | 6/2003 | Binder et al. | |
| 6,585,780 B2 | 7/2003 | Koola et al. | |
| 6,585,933 B2 | 7/2003 | Ehrhardt et al. | |
| 6,596,386 B1 | 7/2003 | Reck et al. | |
| 6,599,997 B2 | 7/2003 | Araki et al. | |
| 6,730,729 B2 | 5/2004 | Gerst et al. | |
| 6,753,361 B2 | 6/2004 | Kroner et al. | |
| 6,984,675 B2 | 1/2006 | Lesley et al. | |
| 7,199,179 B2 * | 4/2007 | Clamen et al. | 524/560 |
| 2002/0091185 A1 | 7/2002 | Taylor et al. | |
| 2002/0130439 A1 | 9/2002 | Kroner et al. | |
| 2004/0115429 A1 | 6/2004 | Michl et al. | |

* cited by examiner

AQUEOUS FORMALDEHYDE-FREE COMPOSITION AND FIBERGLASS INSULATION INCLUDING THE SAME

CROSS-REFERENCE TO RELATED APPLICATIONS

This application is a continuation of U.S. application Ser. No. 10/222,617 filed on Aug. 16, 2002, and incorporated herein.

BACKGROUND

The invention relates to aqueous formaldehyde-free compositions that include hydroxy functional, carboxy functional polymers.

Fibrous glass insulation products generally include glass fibers bonded together by a cured thermoset polymeric composition. Processes for making fiberglass insulation generally include drawing molten streams of glass into fibers of random lengths that are blown into a forming chamber where they are randomly deposited as a web onto a traveling conveyor. The fibers, while in transit in the forming chamber and while still hot from the drawing operation, are sprayed with an aqueous binder composition, e.g., a formaldehyde-based binder. The residual heat from the glass fibers and the flow of air through the fibrous mat during the forming operation are generally sufficient to volatilize the majority to all of the water from the binder, thereby leaving the remaining components of the binder on the fibers as a viscous or semi-viscous high solids liquid. The coated fibrous web is then transferred to a curing oven where heated air is blown through the web to cure the binder and bond the glass fibers together.

During the curing reaction, formaldehyde and low molecular weight phenol-formaldehyde compounds are volatilized from the composition and into the surrounding environment, which is undesirable for the people working around the fiberglass insulation manufacturing process and may be harmful to the environment.

A number of formaldehyde-free fiberglass binder compositions have been developed. Some of these compositions include $\alpha,\beta$-ethylenically unsaturated carboxylic acid polymers, polyols and condensation accelerators. These compositions are applied to glass fibers and then dried in ovens at high temperatures to effect crosslinking. A portion of the lower molecular weight polyols present in the compositions may volatilize during the drying operation producing undesirable volatile organic compound (VOC) emissions. Some of these compositions are also in the form of emulsions, which can create processing and equipment difficulties during fiberglass manufacturing. Some of these formulations are also in the form of two part compositions requiring the user to mix the parts of the composition prior to use.

SUMMARY

In one aspect, the invention features an aqueous composition that includes a) aqueous hydroxy functional, carboxy functional solution polymer that includes the reaction product of at least 5% by weight $\alpha,\beta$-ethylenically unsaturated hydroxy functional monomer, at least 30% by weight ethylenically unsaturated carboxylic acid monomer, 0% by weight to less than 50% by weight $\alpha,\beta$-ethylenically unsaturated nonhydroxy functional, noncarboxy functional monomer, and chain transfer agent, and b) condensation accelerator.

In one embodiment, the aqueous hydroxy functional carboxy functional polymer has a number average molecular weight no greater than 10,000. In other embodiments, the aqueous composition has a pH less than 7. In some embodiments, the aqueous composition has a pH from about 2 to about 4.

In another embodiment, the $\alpha,\beta$-ethylenically unsaturated hydroxy functional monomer is 2-hydroxy ethyl acrylate. In one embodiment, the ethylenically unsaturated carboxylic acid monomer is glacial acrylic acid. In some embodiments, the aqueous hydroxy functional carboxy functional polymer is prepared from no greater than 40% by weight $\alpha,\beta$-ethylenically unsaturated nonhydroxy functional, noncarboxy functional monomer.

In other embodiments, the aqueous hydroxy functional carboxy functional polymer includes from 20% by weight to 60% by weight solids.

In another embodiment, the aqueous hydroxy functional carboxy functional polymer has an acid number of at least 300 mg KOH/g dried polymer.

In one embodiment, the composition exhibits a dry tensile strength of at least 5 when tested according to the Dry Tensile Strength Test Method. In another embodiment, the composition exhibits a wet tensile strength of at least 5 when tested according to the Wet Tensile Strength Test Method.

In some embodiments, the aqueous hydroxy functional, carboxy functional polymer includes the reaction product of from 10% by weight to 70% by weight $\alpha,\beta$-ethylenically unsaturated hydroxy functional monomer, from 40% by weight to 90% by weight ethylenically unsaturated carboxylic acid monomer, and chain transfer agent. In other embodiments, the aqueous hydroxy functional, carboxy functional polymer includes the reaction product of from 20% by weight to 60% by weight $\alpha,\beta$-ethylenically unsaturated hydroxy functional monomer, from 50% by weight to 90% by weight ethylenically unsaturated carboxylic acid monomer, and chain transfer agent. In another embodiment, the aqueous hydroxy functional, carboxy functional polymer includes the reaction product of from 20% by weight to 60% by weight $\alpha,\beta$-ethylenically unsaturated hydroxy functional monomer, from 60% by weight to 80% by weight ethylenically unsaturated carboxylic acid monomer, and chain transfer agent.

In other embodiments, the aqueous composition includes a) aqueous hydroxy functional, carboxy functional solution polymer consisting essentially of the reaction product of at least 5% by weight $\alpha,\beta$-ethylenically unsaturated hydroxy functional monomer, at least 30% by weight ethylenically unsaturated carboxylic acid monomer, and chain transfer agent, and b) condensation accelerator.

In another aspect, the invention features fiberglass insulation that includes a nonwoven web that includes glass fibers, and a binder composition that includes a) the reaction product of aqueous hydroxy functional carboxy functional polymer comprising the reaction product of at least 5% by weight $\alpha,\beta$-ethylenically unsaturated hydroxy functional monomer, at least 30% by weight ethylenically unsaturated carboxylic acid monomer, from 0% by weight to less than 50% by weight $\alpha,\beta$-ethylenically unsaturated nonhydroxy functional, noncarboxy functional monomer, and chain transfer agent, and b) condensation accelerator. In one embodiment, the fiberglass insulation includes from about 5% by weight to about 14% by weight dried binder composition based on the weight of the glass fibers.

In another aspect, the invention features a method of making fiberglass insulation, the method including contacting glass fibers with a binder composition that includes a) aqueous hydroxy functional carboxy functional polymer that includes the reaction product of at least 5% by weight $\alpha,\beta$-ethylenically unsaturated hydroxy functional monomer, at least 30% by weight ethylenically unsaturated carboxylic acid monomer, less than 50% by weight nonhydroxy functional, noncarboxy functional monomer, and chain transfer agent, and b) condensation accelerator, and curing the composition.

The invention features a composition that is useful as a binder in fiberglass insulation and can be provided as a one part formulation.

The invention features a method of making fiberglass insulation during which low levels or no volatile organic compounds including, e.g., polyols and amines, are emitted by the binder composition.

The composition is well suited to application in manufacturing fiberglass insulation, which can be constructed to exhibit soft hand, good resiliency and good wet and dry strength.

Other features of the invention will be apparent from the following description of the preferred embodiments thereof, and from the claims.

GLOSSARY

In reference to the invention, these terms have the meanings set forth below.

The phrase "hydroxy functional carboxy functional polymer" refers to a polymer that includes hydroxyl moieties and carboxylic acid moieties.

DETAILED DESCRIPTION

The aqueous composition includes aqueous hydroxy functional carboxy functional addition polymer and condensation accelerator. The aqueous composition preferably exhibits a wet tensile strength of at least about 5 pounds of force (lbf), more preferably at least about 6 lbf, in other embodiments at least 7 when tested according to the Wet Tensile Strength Test Method and a dry tensile strength of at least about 5 lbf, more preferably at least about 9 lbf, in other embodiments at least 10 when tested according to the Dry Tensile Strength Test Method.

The aqueous hydroxy functional carboxy functional polymer includes the reaction product of $\alpha,\beta$-ethylenically unsaturated hydroxy monomer, ethylenically unsaturated carboxylic acid monomer, chain transfer agent, and, optionally free radical initiator. The aqueous hydroxy functional carboxy functional polymer can be in the form of a solution, dispersion, emulsion or suspension. The aqueous hydroxy functional carboxy functional polymer is water soluble and preferably prepared by free radical solution polymerization. Other suitable polymerization techniques include, e.g., emulsion polymerization and suspension polymerization techniques. For emulsion polymerization, anionic surfactants, nonionic surfactants and combinations thereof can be used. Preferably the aqueous hydroxy functional carboxy functional polymer is a random copolymer.

The aqueous hydroxy functional carboxy functional polymer preferably has an average number molecular weight (Mn) from 1000 g/mole to 10,000,000 g/mole, in some embodiments less than 250,000 g/mole, in some embodiments less than about 15,000 g/mole, in some embodiments less than about 10,000 g/mole, in some embodiments less than about 7,000 g/mole, in some embodiments less than about 5,000 g/mole, in some embodiments from about 5000 g/mole to about 10,000 g/mole.

The aqueous hydroxy functional carboxy functional polymer preferably has an acid number of at least 300 mg KOH/g dried material (i.e., dried polymer and residual solids present in the aqueous solution polymer composition), in some embodiments at least 380 mg KOH/g dried material, in other embodiments at least 450 mg KOH/g dried material, in other embodiments at least 500 mg KOH/g dried material, in other embodiments no greater than 780 mg KOH/g dried material, in other embodiments no greater than 710 mg KOH/g dried material, in other embodiments no greater than 650 mg KOH/g dried material, in other embodiments no greater than 600 mg KOH/g dried material.

Useful $\alpha,\beta$-ethylenically unsaturated hydroxy functional monomers include, e.g., $\alpha,\beta$-ethylenically unsaturated monohydroxy functional monomers including, e.g., hydroxy alkyl acrylate monomers including, e.g., hydroxy methyl acrylate, hydroxy ethyl acrylate, 2-hydroxy ethyl acrylate, hydroxy propyl acrylate, hydroxy butyl acrylate, and hydroxy alkyl methacrylates, $\alpha,\beta$-ethylenically unsaturated polyhydroxy monomers including, e.g., polyethylene glycol monomethacrylate, and combinations thereof.

The aqueous hydroxy functional carboxy functional polymer is preferably prepared from $\alpha,\beta$-ethylenically unsaturated hydroxy functional monomers in an amount of at least 5% by weight, in other embodiments 10% by weight, in other embodiments at least 20% by weight, in some embodiments at least 25% by weight, in other embodiments no greater than 75% by weight, in other embodiments no greater than 50% by weight, in other embodiments no greater than 45% by weight.

Suitable ethylenically unsaturated carboxylic acid monomers include, e.g., acrylic acid, glacial acrylic acid, methacrylic acid, isooctyl acrylic acid, crotonic acid, isocrotonic acid, fumaric acid, cinnamic acid, maleic acid, 2-methylmaleic acid, itaconic acid, 2-methylitaconic acid, $\alpha,\beta$-methyleneglutaric acid, methacrylic anhydride, isooctyl acrylic anhydride, crotonic anhydride, fumaric anhydride, and maleic anhydride.

The polymer preferably includes ethylenically unsaturated carboxylic acid monomers in an amount less than 100% by weight, in some embodiments no greater than 98% by weight, in other embodiments no greater than 90% by weight, in other embodiments no greater than 80% by weight, in other embodiments, no greater than 75% by weight, in other embodiments at least 30% by weight, in other embodiments at least 40% by weight, in other embodiments at least 50% by weight, in other embodiments at least 60% by weight, in other embodiments at least 65% by weight.

Suitable chain transfer agents include, e.g., sodium hypophosphite, thioglycolic acid, mercaptans including, e.g., primary octyl mercaptan, 2-mercaptoethanol, n-dodecylmercaptan, n-octylmercaptan, t-dodecyl mercaptan, mercaptoethanol, iso-octyl thioglycolurate, mercapto carboxylic acids having 2 to 8 carbon atoms, and their esters, examples of which include 3-mercapto propionic acid and 2-mercapto propionic acid, halogenated hydrocarbons including, e.g., carbonbromo compounds (e.g., carbon tetrabromide and bromotrichloromethane) and combinations thereof. The chain transfer agent can be present in the mixture used to form the hydroxy functional polycarboxylic acid polymer in an amount no greater than 5% by weight, preferably from 1% by weight to about 4% by weight, more preferably from 1% by weight to about 3% by weight based on the monomer weight.

Suitable free radical initiators include oxidizing agents including, e.g., water-soluble peroxy compounds such as hydrogen peroxide, t-butyl-hydroperoxide, di-t-butyl peroxide, cumene hydroperoxide, acetylacetone peroxide, t-butyl perneodecanoate, t-butyl perneohexanoate, t-butyl per-2-ethylhexanoate, t-butyl perbenzoate, t-butyl perpivalate, t-butyl pivalate, t-amyl perpivalate, di-t-butyl peroxide, dibenzoyl peroxide, dicyclohexyl peroxodicarbonate, dibenzoyl peroxodicarbonate, dilauroyl peroxide, methyl ethyl ketone peroxide; water-soluble inorganic persulphates including, e.g., ammonia persulfate, lithium persulfate, potassium persulfate and sodium persulfate; water-soluble azo compounds including, e.g., 4,4'-azobis(4-cyanovaleric acid) or its salts, azodiisobutyronitrile, 2,2'-azobis(2-amidinopropane)dihydrochloride, and 2-(carbamoylazo)isobutyonitrile, and combinations thereof.

The free radical initiator can be present in the reaction mixture in an amount no greater than 10% by weight based on the weight of the monomer(s) charged to the reaction vessel.

The free radical initiator can be part of an initiator system that includes oxidizing agent and reducing agent. Suitable reducing agents include, e.g., sodium formaldehyde-sulfoxylate, ferrous salts, sodium dithionite, sodium hydrogen sulfite, sodium sulfite, sodium thiosulfate, sodium bisulphate, ascorbic acid, erythorbic acid and the sodium salts of ascorbic acid and erythorbic acid, and combinations thereof.

The initiator system can also include a transition metal catalyst including, e.g., salts of iron, cobalt, nickel, copper, vanadium and manganese. Examples of suitable catalysts include iron (II) sulfate, cobalt (II) chloride, nickel (II) sulfate, copper (I) chloride, and combinations thereof.

The amount of the initiator system (i.e. including the oxidizing agent and, where present, reducing agent and catalyst) is from 0.01% by weight to 20% by weight based on the weight of the monomer(s) charged to the reaction vessel.

The reaction mixture from which the hydroxy functional carboxy functional polymer is prepared is preferably free of $\alpha,\beta$-ethylenically unsaturated nonhydroxy functional, noncarboxy functional monomer, i.e., $\alpha,\beta$-ethylenically unsaturated monomer that does not include at least one of a hydroxy functional group and a carboxy functional group. When present, the $\alpha,\beta$-ethylenically unsaturated nonhydroxy functional, noncarboxy functional monomer is preferably present in an amount of less than 50% by weight based on the weight of the hydroxy functional carboxy functional polymer.

The condensation accelerator of the aqueous composition speeds the condensation reaction that occurs as the polymer cures. Suitable condensation accelerators include, e.g., phosphorous-based catalysts including, e.g., sodium hypophosphite and phosphoric acid, para toluene sulfonic acid, any strong acids including, e.g., hydrochloric acid, sulfuric acid, trichloroacetic acid, and e.g., acidic metal salts including, e.g., aluminum chloride, iron chloride, zirconium oxychloride, chromic nitrate, chromic perchlorate, aluminum nitrate, iron nitrate, zinc nitrate and combinations thereof.

The condensation accelerator can be present in the aqueous composition in an amount no greater than 15% by weight, preferably from 3% by weight to about 6% by weight based on the weight of the aqueous hydroxy functional carboxy functional solution polymer.

The aqueous composition can also include other components including, e.g., emulsifiers, surfactants, pigments, fillers, biocides, anti-mycotics including, e.g., fungicides and mold inhibitors, plasticizers, anti-foaming agents, colorants, waxes, antioxidants, adhesion promoting agents including, e.g., silanes and boranes, odor masking agents, and combinations thereof.

The aqueous composition is essentially free of (i.e., has less than 10,000 parts per million (ppm)) and preferably free of formaldehyde and phenol-formaldehyde.

The aqueous composition preferably is essentially free of (i.e., has less than 10,000 ppm) polyol having an acid number less than 100 mg KOH/g dried material, examples of which include ethylene glycol, glycerol, pentaerythritol, trimethylol propane, sorbitol, sucrose, glucose, resorcinol, catechol, pyrogallol, glycollated ureas, 1,4-cyclohexane diol, dethanolamine, triethaniolamine, $\alpha,\beta$-ethylenically unsaturated hydroxy functional monomer, and combinations thereof.

The aqueous composition can be formulated to exhibit a viscosity suitable for the intended use and application methods. Preferably the composition has a viscosity suitable for spray applications. Useful aqueous compositions exhibit a viscosity no greater than 10,000 cps, in other embodiments no greater than 5,000 cps, in other embodiments no greater than 3,000 cps, in other embodiments no greater than 500 cps.

The aqueous composition can be formulated to include from 20% by weight to 60% by weight solids (i.e., the components remaining after drying a one gram sample at 110° C. for two hours), more preferably from 30% by weight to 50% by weight solids, most preferably from 35% by weight to 45% by weight solids, and to exhibit a pH less than 7, in some embodiments from 1 to 5, in some embodiments from about 2 to about 4. The pH of the composition can be altered to the desired level using any suitable acid or base including, e.g., sulfuric acid, phosphoric acid, erythobic acid, triethanolamine, ammonia, sodium hydroxide, potassium hydroxide, sodium carbonate, t-butylammonium hydroxide, and combinations thereof.

The aqueous composition can be prepared by admixing the aqueous hydroxy functional carboxy functional addition polymer and the condensation accelerator using any suitable mixing technique.

The aqueous composition can be applied to a variety of substrates and then condensed, e.g., through the application of energy (e.g., heating) and evaporation of water, to form the condensed (i.e., crosslinked), dried polymer. Preferably the aqueous composition is heated in an oven at a temperature and for a period sufficient to condense the polymer, preferably from about 150° C. to about 220° C. for from about 2 to 5 minutes. The drying and curing functions can be carried out in two or more steps. One useful method, which is known as B-staging, includes heating the composition at a temperature and for a time sufficient to substantially dry but not substantially cure the composition, and then heating the composition for a second period to effect curing.

The aqueous composition is particularly useful as a binder composition in fiberglass insulation. The glass fibers of the nonwoven web are preferably maintained in fixed relation to each other through the dried composition. The fiberglass insulation preferably includes dried composition in an amount of from about 1% by weight to about 20% by weight dried based on the weight of the glass fibers, in some embodiments from about 5% by weight to about 10% by weight based on the weight of the glass fibers.

The aqueous composition can also be used as a binder composition in a variety of applications including, e.g., for polymeric fibers including, e.g., synthetic polymer fibers including, e.g., polyolefin (e.g., polyethylene and polypropylene), polyester, polyacrylonitrile, polyvinyl acetate, polyvinyl chloride, polyamide, polyacrylamide, rayon, cellulose, cellulose polymers, and combinations thereof.

The fibers can be in a variety of forms including, e.g., individual fibers, nonwoven and woven fibrous webs, sheets, lofty fibrous products, filaments, strands, ropes, rolls, batts, reinforcing mats for roofing applications, mats for flooring applications, reinforcement scrims, and combinations thereof.

The aqueous composition can be applied using a variety of application techniques including, e.g., spraying, soaking, immersing, saturating, coating, e.g., roll coating, curtain coating, brush coating, beater deposition, and combinations thereof.

The fiberglass web can be useful in a variety of applications including, e.g., insulation, reinforcing mats for applications including, e.g., roofing and flooring, substrates for printed circuit boards, battery separators, filters, tape, duct liners, duct board, and reinforcement scrims.

The invention will now be described further by way of the following examples. All parts, ratios, percents and amounts stated in the Examples are by weight unless otherwise specified.

EXAMPLES

Test Procedures

Test procedures used in the examples include the following.

Viscosity

Viscosity is measured using a Brookfield Model RVF-100 viscometer (Brookfield Engineering Laboratories, Inc., Stoughton, Mass.) at ambient room temperature (i.e., 23° C. to 25° C.), using spindle #2 run at 20 rotations per minute (rpm) for 20 minutes. After 20 minutes a reading is taken and recorded in centipoise.

Dry Tensile Strength

A sample composition is reduced to 1% solids solution with water. A glass microfiber filter paper (20 cm×30 cm) grade GF/C WHATMAN No. 1822-915 (Whatman International Ltd., Maidstone, England) is then immersed in the 1% solids solution at ambient conditions (i.e., 23 C and about 50% relative humidity) for 5 minutes to saturate the microfiber filter paper. Excess solution is removed from the sheet using vacuum suction. The treated paper is then placed in a convection oven for 5 minutes at 180° C. to cure the composition. The cured microfiber filter paper is then cut into 2 in×5 in strips and tested for dry tensile strength according to the test method TAPPI T-494 om-96 Tensile Properties of Paper and Paperboard (Using Constant Rate Of Elongation Apparatus), 1996 (which is incorporated herein), with the following exceptions: at section 4.1.4, the crosshead speed is 0.1 in/min instead of 0.25 cm/min; at section 5.4, the specimen size is 2 in×5 in; at section 6.4, the span is 5 in instead of 7 in; at section 6.5, the crosshead speed is 0.1 in/min instead of 0.25 cm/min. The results are reported in units of pounds of force (lbf).

Wet Tensile Strength Test Method

A cured microfibre filter paper prepared according to the Dry Tensile Strength Test Method is then conditioned in a temperature/humidity oven for 60 minutes at 110° C. and 90% relative humidity. The paper is allowed to equilibrate at ambient temperature for 1 hour and then cut into 2 in×5 in strips. The strips are evaluated for wet tensile strength using the test method TAPPI T-494 om-96 Tensile Properties of Paper and Paperboard (Using Constant Rate Of Elongation Apparatus), 1996 (which is incorporated herein) with the following exceptions: at section 4.1.4, the crosshead speed is 0.1 in/min instead of 0.25 cm/min; at section 5.4, the specimen size is 2 in×5 in; at section 6.4, the span is 5 in instead of 7 in; and at section 6.5, the crosshead speed is 0.1 in/min instead of 0.25 cm/min. The results are reported in units of pounds of force (lbf).

Loss On Ignition (L.O.I.)

A portion a cured microfiber filter paper prepared according to the dry strength test method is weighed and the weight recorded ($W_1$). The paper is placed in a crucible, which is then placed in a muffle furnace for 20 minutes at 700° C. The paper is then cooled in the oven, removed from the oven and weighed and the weight is recorded ($W_2$). The binder loading is then calculated by dividing the change in weight ($W_2-W_1$) by the original weight ($W_1$) of the microfiber filter paper and multiplying by 100. The results are recorded in units of %.

Method of Determining Acid Number

Acid number is determined by placing a 2 g dried polymer sample in a 250 mL glass Erlenmeyer flask, and then adding 100 ml of acetone to the flask. A stirring bar is placed in the flask and the sample is refluxed with a water-cooled condenser on a with stirring until the sample is completely dissolved. If the sample has not dissolved after 30 minutes of refluxing use it as is. The solution is then allowed to cool to room temperature. One ml phenolphthalein indicator is added to the solution. The flask is then stirred while titrating to a pink end point using standardized 0.1 N alcoholic potassium hydroxide. The endpoint should persist for five minutes. The volume of potassium hydroxide required to reach the endpoint is recorded in milliliters (ml).

A blank of 100 ml acetone is placed in a glass Erlenmeyer flask, 1 ml of phenolphthalein indicator is added to the solution, and the mixture is then titrated using standardized 0.1 N alcoholic potassium to a pink endpoint. The volume of potassium hydroxide required to reach the endpoint is recorded in milliliters.

The acid number is then calculated according to the following equation:

$$\text{Acid Number} = \frac{(A \times N \times 56.1)}{w}$$

where A=milliliters of potassium hydroxide titrated (sample—blank), N=normality of the potassium hydroxide solution and w=grams of sample. The results are reported in mg KOH/g dried material.

Example 1

An aqueous solution polymer of 70/30 glacial acrylic acid/2-hydroxyethyl acrylate (HEA/AA) was prepared by charging 481.4 g water, 5.6 g 50% hydrogen peroxide, and 0.097 g DISSOLVINE 4.5% H—Fe (Akzo Nobel Chem. Inc., Lima, Ohio) to a reaction vessel. A monomer feed of 363.6 g glacial acrylic acid, 155.8 g 2-hydroxyethyl acrylate, and 2.11 g 2-mercaptoethanol was then fed into the reaction vessel. Additional mixtures of 58.7 g water and 5.36 g 50% hydrogen peroxide, and a mixture of 60 g water and 4.07 g erythorbic acid were then fed into the reaction vessel. A first mixture of 5.8 g water, 0.70 g tertbutylhydrogen peroxide, 5.8 g water, and 0.48 g erythorbic acid was then added to the reaction vessel, which was maintained at 70° C. A second mixture of 5.8 g water, 0.70 g tertbutylhydrogen peroxide, 5.8 g water, and 0.48 g erythorbic acid was then added to the reaction vessel, which was maintained at 72° C.

PROXEL GXL biocide (Avecia Inc., Wilmington, Del.) was then added to the reaction vessel in an amount of 4.81 g. The composition was adjusted with water to a solids content of 46%, a pH of 1.47, and a viscosity of 5,000 cps. The resulting polymer had a number average molecular weight of 7500 and an acid number of 546 mg KOH/g dried material.

Examples 2-6

Examples 2-6 were prepared according to the procedure described in Example 1 with the exception that the amount (i.e., % by weight) acrylic acid monomer and hydroxy ethyl acrylate monomer (AA/HEA) added to the reaction vessel was as follows: 90/10 AA/HEA (Example 2), 80/20 AA/HEA (Example 3), 70/30 AA/HEA (Example 4), 60/40 AA/HEA (Example 5), and 50/50 AA/HEA (Example 6).

Three percent by weight sodium hypophosphite monohydrate based on the total solids weight was added to each of the compositions of Examples 2-6 after the polymers were prepared.

Example 7

An aqueous solution polymer of 70/30 glacial acrylic acid/2-hydroxyethyl acrylate (AA/2-HEA) was prepared by charging 600 g water, 5.6 g 50% hydrogen peroxide, 0.1 g DISSOLVINE 4.5% H—Fe (Akzo Nobel Chem. Inc.), and 0.055 g (based on 0.01% solids) SILQUEST A-171 silane (Crompton Corp., Greenwich, Conn.) to a reaction vessel. Mixtures of 59 g water and 5.5 g 50% hydrogen peroxide, and a mixture of 60 g water and 4 g erythorbic acid were then fed into the reaction vessel. A monomer feed of 364 g glacial acrylic acid, 156 g 2-hydroxyethyl acrylate, and 9.5 g 2-mercaptoethanol was then fed into the reaction vessel. A first mixture of 5.8 g water, 0.7 g 70% tertbutylhydrogen peroxide, 5.8 g water, and 0.48 g erythorbic acid was then added to the reaction vessel, which was maintained at 70° C. A second mixture of 5.8 g water, 0.7 g 70% tertbutylhydrogen peroxide, 5.8 g water, and 0.48 g erythorbic acid was then added to the reaction vessel, which was maintained at 70° C. A third mixture of 5.8 g water, 0.7 g 70% tertbutylhydrogen peroxide, 5.8 g water, and 0.48 g erythorbic acid was then added to the reaction vessel, which was maintained at 70° C.

The aqueous solution polymer was cooled to less than 30° C. and 50% sodium hydroxide was added to the composition to achieve a pH of 2.35. The composition had a solids content of 41%, and a viscosity of 195 cps. The resulting polymer had a number average molecular weight of 3910 and an acid number of 546 mg KOH/g dried material.

Example 8

An aqueous polymer solution of 70/30 (glacial acrylic acid/2-hydroxyethyl acrylate) was prepared by charging 713.9 g water, 6 g 50% hydrogen peroxide, 0.1 g DISSOLVINE 4.5% iron solution and 10.8 g sodium hypophosphite monohydrate to a reaction vessel and heated to 70° C. A monomer blend consisting of 404.4 g glacial acrylic acid and 173.31 g 2-hydroxyethyl acrylate (2-HEA) and was uniformly added to the reactor over a three hour period with mechanical agitation. At the same time, additional mixtures of 63.8 g water and 5.8 g 50% hydrogen peroxide and a mixture of 66 g water and 4.3 g erythorbic acid were uniformly fed into the reactor over a 3.5 hour period. After completion of the feeds, the reactor content was heated an additional 30 minutes at 70° C. The reactor was then charged with a mixture of 12.6 g water and 1.5 g tetrabutylhydrogen peroxide 70% and a mixture of 12.6 g water and 1.04 g erythorbic acid and stirred an additional 15 minutes at 70° C.

The resulting aqueous solution polymer was cooled to room temperature. A mixture of 15 g water and 12.3 g sodium hypophosphite monohydrate was then charged to the reactor.

The polymer had a number average molecular weight (Mn) of 7,360 g/mole

One part-per-hundred ammonium chloride based on the total weight of the aqueous solution polymer composition was then charged to the aqueous solution polymer composition. The aqueous solution polymer composition was cured by drying in a forced air oven at 180° C. for 5 minutes. The resulting cured composition exhibited a dry tensile strength of 11.8 lb/ft and a wet tensile strength of 4.1 lb/ft.

Example 9

An aqueous polymer solution of 70/30 (2-hydroxylethylacrylate/glacial acrylic acid) was prepared by charging 535 g water, 4.5 g 50% hydrogen peroxide, 0.1 g DISSOLVINE 4.5% iron solution, and 8.1 g sodium hypophosphite monohydrate to a reaction vessel and heated to 70° C. A blend consisting of 130 g glacial acrylic acid and 303 g 2-hydroxylethylacrylate (2-HEA) was uniformly added to the reactor over a three hour period using mechanical agitation. At the same time, additional mixtures of 48 g water and 4.4 g 50% hydrogen peroxide and a mixture of 48 g water and 3.25 g erythorbic acid were uniformly fed into the reactor over a 3.5-hour period. After completion of the feeds, the reactor content was heated an additional 30 minutes at 70° C. The reactor was then charged with a mixture of 4.7 g water and 0.6 g tetrabutylhydrogen peroxide and a mixture of 4.7 g water and 0.4 g erythorbic acid and stirred an additional 15 minutes at 70° C. The resulting solution polymer was charged with a mixture of 16 g sodium hypophosphite and 16 water.

The resulting aqueous solution polymer had a pH of 2.4, a viscosity of 320 cps at 25° C., and a solid content of 41%.

Example 10

An aqueous polymer solution of 70/30 (glacial acrylic acid/2-hydroxylethylacrylate) was prepared by charging 600 g water, 5.6 g 50% hydrogen peroxide, 0.1 g DISSOLVINE 4.5% iron solution, and 16 g sodium hypophosphite monohydrate to a reaction vessel and heated to 70° C. A blend of 364 g glacial acrylic acid and 156 g 2-hydroxylethylacrylate (2-HEA) was uniformly added to the reactor over a three hour period using mechanical agitation. At the same time, additional mixtures of 60 g water and 5.4 g 50% hydrogen peroxide, and a mixture of 60 g water and 4 g erythorbic acid were uniformly fed into the reactor over a 3.5 hour period. After completion of the feeds, the reactor content was heated an additional 30 minutes at 70° C. The reactor was then charged with a mixture of 12 g water and 1.5 g tetrabutylhydrogen peroxide, and a mixture of 12 g water and 1 g erythorbic acid and stirred an additional 15 minutes at 70° C.

The resulting aqueous solution polymer had a pH of 2.5, a viscosity of 200 cps at 25° C., a solid content of 42%, a number average molecular weight of 2,300 g/mol, a dry tensile strength of 6.1+/−0.4 lb/f, and a wet tensile strength of 7.7+/−0.7 lb/f.

The compositions of Examples 2-10 were tested according to the above test methods to determine the following: pH, acid number, viscosity, Dry Tensile Strength, Wet Tensile strength, and Loss On Ignition (L.O.I.). The results are reported in Table 1.

TABLE 1

| Example | PH | Viscosity (cps) | Solids | Acid Number | AA/HEA | Dry Tensile Strength (lbf) | Wet Tensile Strength (lbf) | L.O.I. (%) |
|---|---|---|---|---|---|---|---|---|
| 2 | 1.5 | 350 | 42 | 702 | 90/10 | 6.1 | 5.8 | 7.1 |
| 3 | 1.7 | 280 | 41 | 624 | 80/20 | 9.8 | 5.8 | 8 |

TABLE 1-continued

| Example | PH | Viscosity (cps) | Solids | Acid Number | AA/HEA | Dry Tensile Strength (lbf) | Wet Tensile Strength (lbf) | L.O.I. (%) |
|---|---|---|---|---|---|---|---|---|
| 4 | 1.9 | 220 | 41 | 546 | 70/30 | 10.2 | 5.7 | 5.4 |
| 5 | 1.8 | 220 | 41 | 468 | 60/40 | 10.2 | 6.2 | 6.4 |
| 6 | 1.7 | 190 | 41 | 390 | 50/50 | 10.9 | 10.4 | 12 |
| 7 | 2.4 | 195 | 41 | 546 | 70/30 | NT | NT | NT |
| 8 | 2.4 | 650 | 41 | 546 | 70/30 | 11.8 | 4.1 | 7 |
| 9 | 2.4 | 320 | 41 | 237 | 30/70 | NT | NT | NT |
| 10 | 2.5 | 200 | 42 | 237 | 30/70 | 6.1 | 7.7 | NT |
| Control (Glass fiber sheet) | NA | NA | NA | NA | 0/0 | 2.6 | NT | 0 |

NA = not applicable
NT = not tested

Other embodiments are within the claims.

What is claimed is:

1. Fiberglass insulation comprising:
   a) a nonwoven web comprising glass fibers; and
   b) a composition comprising the reaction product of
      i) aqueous hydroxy functional carboxy functional polymer comprising the reaction product of
         at least 5% by weight α,β-ethylenically unsaturated hydroxy functional monomer,
         at least 30% by weight ethylenically unsaturated carboxylic acid monomer,
         from 0% by weight to less than 50% by weight α,β-ethylenically unsaturated nonhydroxy functional, noncarboxy functional monomer, and
         chain transfer agent, and
      ii) condensation accelerator,
   said composition being essentially free of glycerol and α,β-ethylenically unsaturated hydroxy functional monomer.

2. The fiberglass insulation of claim 1, wherein said composition is essentially free of ethylene glycol, pentaerythritol, trimethylol propane, sorbitol, sucrose, glucose, resorcinol, catechol, pyrogallol, glycollatedureas, 1,4-cyclohexane diol, dethanolamine, and triethanolamine.

3. The fiberglass insulation of claim 1, wherein said aqueous hydroxy functional, carboxy functional polymer comprises the reaction product of
   i) from 10% by weight to 70% by weight hydroxyethyl acrylate monomer,
   ii) from 40% by weight to 90% by weight acrylic acid monomer, and
   iii) chain transfer agent.

4. The fiberglass insulation of claim 1, wherein said aqueous hydroxy functional, carboxy functional polymer comprises the reaction product of
   i) from 10% by weight to 60% by weight hydroxyethyl acrylate monomer,
   ii) from 50% by weight to 90% by weight acrylic acid monomer, and
   iii) chain transfer agent.

5. The fiberglass insulation of claim 1, wherein said aqueous hydroxy functional, carboxy functional polymer comprises the reaction product of
   i) from 20% by weight to 60% by weight hydroxyethyl acrylate monomer,
   ii) from 60% by weight to 80% by weight acrylic acid monomer, and
   iii) chain transfer agent.

6. The fiberglass insulation of claim 1, wherein said aqueous hydroxy functional carboxy functional polymer has a number average molecular weight no greater than 10,000.

7. A method of making fiberglass insulation comprising:
   a) contacting glass fibers with a composition comprising
      i) aqueous hydroxy functional carboxy functional polymer comprising the reaction product of
         at least 5% by weight α,β-ethylenically unsaturated hydroxy functional monomer,
         at least 30% by weight ethylenically unsaturated carboxylic acid monomer,
         less than 50% by weight nonhydroxy functional, noncarboxy functional monomer,
         chain transfer agent, and
      ii) condensation accelerator,
   said composition being essentially free of glycerol and α,β-ethylenically unsaturated hydroxy functional monomer; and
   b) curing said composition.

8. The method of claim 7, wherein said composition is essentially free of ethylene glycol, pentaerythritol, trimethylol propane, sorbitol, sucrose, glucose, resorcinol, catechol, pyrogallol, glycollated ureas, 1,4-cyclohexane diol, dethanolamine, and triethanolamine.

9. The method of claim 7, wherein said aqueous hydroxy functional carboxy functional polymer has a number average molecular weight no greater than 10,000.

10. The method of claim 7, wherein said aqueous composition has a pH less than 7.

11. The method of claim 7, wherein said aqueous composition has a pH from about 2 to about 4.

12. The method of claim 7, wherein said α,β-ethylenically unsaturated hydroxy functional monomer comprises 2-hydroxy ethyl acrylate.

13. The method of claim 7, wherein said ethylenically unsaturated carboxylic acid monomer comprises glacial acrylic acid.

14. The method of claim 12, wherein said ethylenically unsaturated carboxylic acid monomer comprises glacial acrylic acid.

15. The method of claim 7, wherein said aqueous hydroxy functional carboxy functional polymer is prepared from no greater than 40% by weight α,β-ethylenically unsaturated nonhydroxy functional, noncarboxy functional monomer.

16. The method of claim 7, wherein said aqueous hydroxy functional carboxy functional polymer comprises from 20% by weight to 60% by weight solids.

17. The method of claim 7, wherein said aqueous hydroxy functional carboxy functional polymer has an acid number of at least 300 mg KOH/g dried polymer.

18. The method of claim 7, wherein said aqueous hydroxy functional, carboxy functional polymer comprises the reaction product of
   i) from 10% by weight to 70% by weight α,β-ethylenically unsaturated hydroxy functional monomer,
   ii) from 40% by weight to 90% by weight ethylenically unsaturated carboxylic acid monomer, and
   iii) chain transfer agent.

19. The method of claim 7, wherein said aqueous hydroxy functional, carboxy functional polymer comprises the reaction product of
   i) from 10% by weight to 60% by weight α,β-ethylenically unsaturated hydroxy functional monomer,
   ii) from 50% by weight to 90% by weight ethylenically unsaturated carboxylic acid monomer, and
   iii) chain transfer agent.

20. The method of claim 7, wherein said aqueous hydroxy functional, carboxy functional polymer comprises the reaction product of
   i) from 20% by weight to 60% by weight α,β-ethylenically unsaturated hydroxy functional monomer,
   ii) from 60% by weight to 80% by weight ethylenically unsaturated carboxylic acid monomer, and
   iii) chain transfer agent.

21. The method of claim 7, wherein said aqueous hydroxy functional, carboxy functional polymer comprises the reaction product of
   i) from 10% by weight to 70% by weight hydroxyethyl acrylate monomer,
   ii) from 40% by weight to 90% by weight acrylic acid monomer, and
   iii) chain transfer agent.

22. The method of claim 7, wherein said aqueous hydroxy functional, carboxy functional polymer comprises the reaction product of
   i) from 10% by weight to 60% by weight hydroxyethyl acrylate monomer,
   ii) from 50% by weight to 90% by weight acrylic acid monomer, and
   iii) chain transfer agent.

23. The method of claim 7, wherein said aqueous hydroxy functional, carboxy functional polymer comprises the reaction product of
   i) from 20% by weight to 60% by weight hydroxyethyl acrylate monomer,
   ii) from 60% by weight to 80% by weight acrylic acid monomer, and
   iii) chain transfer agent.

* * * * *